United States Patent
Dettmann et al.

[11] Patent Number: 5,719,494
[45] Date of Patent: Feb. 17, 1998

[54] SENSOR ASSEMBLY

[75] Inventors: Fritz Dettmann, Sinn-Edingen; Uwe Loreit; Jürgen Kunze, both of Wetzlar; Karl-Heinz Lust, Lahnau, all of Germany

[73] Assignee: Lust Antriebstechnik GmbH, Lahnau-Waldgirmes, Germany

[21] Appl. No.: 543,194

[22] Filed: Oct. 13, 1995

[30] Foreign Application Priority Data

Oct. 15, 1994 [DE] Germany ............... 44 36 876.3

[51] Int. Cl.$^6$ ............... G01R 33/00; G01R 33/02
[52] U.S. Cl. ............... 324/117 R; 324/252
[58] Field of Search ............... 324/117 R, 252, 324/207.19, 207.21, 207.22, 207.26; 338/32 R

[56] References Cited

U.S. PATENT DOCUMENTS

| | | | |
|---|---|---|---|
| 3,820,089 | 6/1974 | Lama | 365/8 |
| 4,385,273 | 5/1983 | Lienhard et al. | 324/117 R |
| 4,464,625 | 8/1984 | Lienhard et al. | 324/117 R |
| 4,712,064 | 12/1987 | Eckardt et al. | 324/207.21 |
| 4,835,510 | 5/1989 | Shibasaki et al. | 338/32 R |
| 5,049,809 | 9/1991 | Wakatsuki et al. | 324/117 R |
| 5,055,786 | 10/1991 | Wakatsuki et al. | 324/252 |
| 5,140,267 | 8/1992 | Shintaku | 324/252 |

(List continued on next page.)

FOREIGN PATENT DOCUMENTS

| | | |
|---|---|---|
| 155 220 | 5/1982 | Germany . |
| 31 31 431 | 2/1983 | Germany . |
| 275 745 | 1/1990 | Germany . |
| 42 12 737 | 7/1993 | Germany . |
| 43 00 605 | 7/1994 | Germany . |
| 43 18 716 | 12/1994 | Germany . |
| 43 19 146 | 12/1994 | Germany . |

OTHER PUBLICATIONS

Patent Abstracts of Japan, English language abstract for JP 59158575, published Aug. 1984, 1 page.
Sensors and Actuators; Proceedings of Eurosensors VI, Jun.-Aug., 1993, vol. 2, 2 pages.
Current Measurements Based on Thin–Film Magnetoresistive Sensors; Sensors and Actuators A, 37–38 (1993), pp. 461–465, Andrae, Kuehn and Pertsch Jun.-Aug. 1993.
New Magnetoresistive Sensors: Engineering and Applications; Sensors and Actuators A27 (1991) May, Nos. 1–3, pp. 763–766, Rottmann and Dettmann.
Les Capteurs Magnétiques; 2429 Electronique Radio Plans, (1990) May, No. 510, pp. 19–26.
A Monolithic Superminiature Magnetoresistive Sensor; 298 NEC Research & Development (1989) Apr., No. 93, p. 11–15, Konno, Kataniwa, Takado, Inui, Takanashi, Sagara, et al.

(List continued on next page.)

*Primary Examiner*—Ernest F. Karlsen
*Assistant Examiner*—Anh Phung
*Attorney, Agent, or Firm*—Flynn, Thiel, Boutell & Tanis, P.C.

[57] ABSTRACT

A sensor assembly for measuring current $I_o$ is disclosed. The sensor assembly includes four magnetoresistive resistors (1, 2, 3, 4) arranged to form a Wheatstone bridge. The bridge is disposed over a U shaped conductor 14. The resistors are arranged so that two resistors (1,2) forming one bridge branch are disposed over one leg of the conductor and the two resistors (3,4) forming the other bridge branch are disposed over the other leg of the conductor. Each resistor is formed out of a number of magnetoresistive strips (1', 2', 3', 4'). The magnetoresistive strips forming the individual bridge branch resistors are interleaved so as to ensure the resistors forming each bridge branch have substantially the same temperature. When current $I_o$ is applied to the conductor, the equal and opposite magnetic fields that develop around the individual bridge branches cause the Wheatstone bridge to produce a signal $U_a$ that is a function of the current.

24 Claims, 2 Drawing Sheets

U.S. PATENT DOCUMENTS

| | | | |
|---|---|---|---|
| 5,247,278 | 9/1993 | Pant et al. | 338/32 R |
| 5,351,027 | 9/1994 | Kawamata et al. | 338/32 R |
| 5,521,501 | 5/1996 | Dettmann et al. | 324/252 |
| 5,561,368 | 10/1996 | Dovek et al. | 324/252 |
| 5,585,775 | 12/1996 | Ishishita | 338/32 R |

OTHER PUBLICATIONS

Current Sensor as a Microsystem, Jürgen Ruhl and Thomas Walther (4 pages) Mon. and Year are not Available.

Stromsensor Als Mikrosystem; 2087 Elektronik 42 (1993) Oct., No. 20, 3 pages, Ruehl and Walther.

SENSOR ASSEMBLY

FIELD OF THE INVENTION

The invention relates to a sensor assembly and, more particularly, a sensor chip comprising a bridge circuit in the form of a Wheatstone bridge for measuring of gradients of the magnetic field strength, consisting of four magnetoresistive resistors which are symmetrically arranged in two areas at a distance from a common center axis into two series-connected resistors bridge branches of the Wheatstone bridge, with the resistors being designed as magnetoresistive laminated strips, and an arrangement for measuring of electrical currents with the help of such a sensor chip.

BACKGROUND OF THE INVENTION

Measuring arrangements for determining of magnetic-field gradients serve in particular the potential-free measurement of the current intensity of an electric current, which causes such a magnetic field. Since the entire surroundings of a magnetic field to be determined in this manner has already large-area interference magnetic fields, it is obvious to differentiate between the field to be measured and the interference magnetic field.

Such arrangements are also already known from the Patents DD 155 220, DD 275 745 and from German Patent DE 42 12 737 C1. Magnetoresistive sensor elements are thereby utilized, since their sensitivity is sufficiently great in order to detect currents over a large measuring range. The linearity of such sensor elements is, however, limited. Its actually high sensitivity depends strongly on the temperature and on an auxiliary magnetic field to be applied to the sensor elements. Moreover the sensitivity of the individual sensor elements is very different. With regard to temperature, problems arise because components adjacent the sensor may unevenly heat the individual sensor elements. This uneven heating causes the temperature of the individual sensor elements to vary so as to cause the output signal from the assembly to drift.

A sensor chip is therefore disclosed in the nonpublished patent application P 43 00 605.1-35 of the Applicant, in which the output signal is proportional to an electrical current to be measured, the sensitivity of which is ideally neither temperature nor auxiliary-field dependent, and which is supposed to have at all times an approximately equal sensitivity. To compensate the interference magnitudes this arrangement thereby assumes that the areas each include a resistor of the one and a resistor of the other bridge branch and that these are arranged symmetrically with respect to the center axis.

SUMMARY OF THE INVENTION

The invention takes over the idea of the symmetrical arrangement of the laminated magnetoresistive strips and has the purpose to improve a sensor chip with respect to its dependency on a temperature gradient effective on it, and to disclose an arrangement for measuring of electrical currents with such a sensor chip. The output signal is proportional to the electrical current to be measured and the sensitivity of the sensor chip is neither temperature nor auxiliary-field dependent and is always supposed to be approximately constant.

The invention attains the purpose in a surprisingly simple manner. The output signal of the sensor chip has a nonlimited linearity range and is neither temperature nor auxiliary-magnet dependent. The sample scattering is extremely low since the topography of the sensor chip can be very precisely manufactured with the help of the microstructuring.

Since the distance of the two areas, namely the base length of the gradiometer, is kept to a minimum, the influence through interference magnetic fields is also insignificant, whereas the sources of which are spaced a large distance from the measuring arrangement.

An arrangement with a sensor chip of the invention has a high degree of geometric symmetry as the condition for a symmetrical heating up of the sensor chip during operation. The symmetrical design of the paired, in-parallel-connected laminated strips substantially eliminates the effects of any temperature gradient in the individual bridge branches so that later compensation is not needed. Through symmetrical temperature increases caused by the operating current, an equal rotation of the magnetization and consequently an equal resistance change is caused in all laminated magnetoresistive strips of the Wheatstone bridge. With this, also the temperature-dependent zero-point drift in the sensor chip is substantially eliminated.

BRIEF DESCRIPTION OF THE DRAWINGS

The invention will be discussed in greater detail hereinafter in connection with one exemplary embodiment and the drawings, in which.

DETAILED DESCRIPTION

Figure 1:
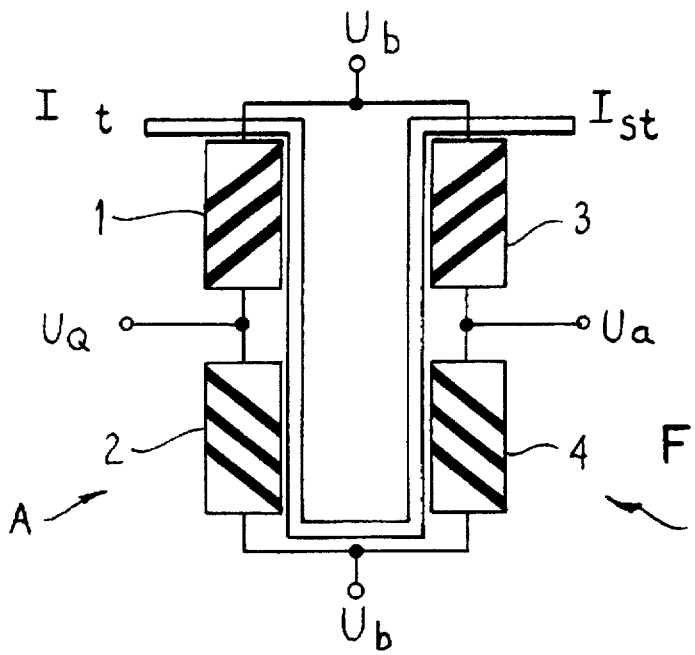
FIG. 1 shows a Wheatstone bridge according to the state of the art.

FIG. 1 illustrates a bridge circuit in the form of a Wheatstone bridge, in which two series-connected magnetoresistive resistors 1 and 2 are arranged in a first bridge branch A and two series-connected magnetoresistive resistors 3 and 4 in a second bridge branch B. The Wheatstone bridge is supplied with an operating voltage $U_b$, an output voltage $U_a$ serves as the output signal. Below at least one of the resistors 1 to 4 there is provided a thin-layer strip line insulated against said resistor; in order to obtain the same structural parts, it is suggested that below each one of the resistors 1 to 4 there is provided a single thin-layer strip line 17. A control current $I_{st}$ flows through the control line 11 through the thin-layer strip line 17.

Figure 2:
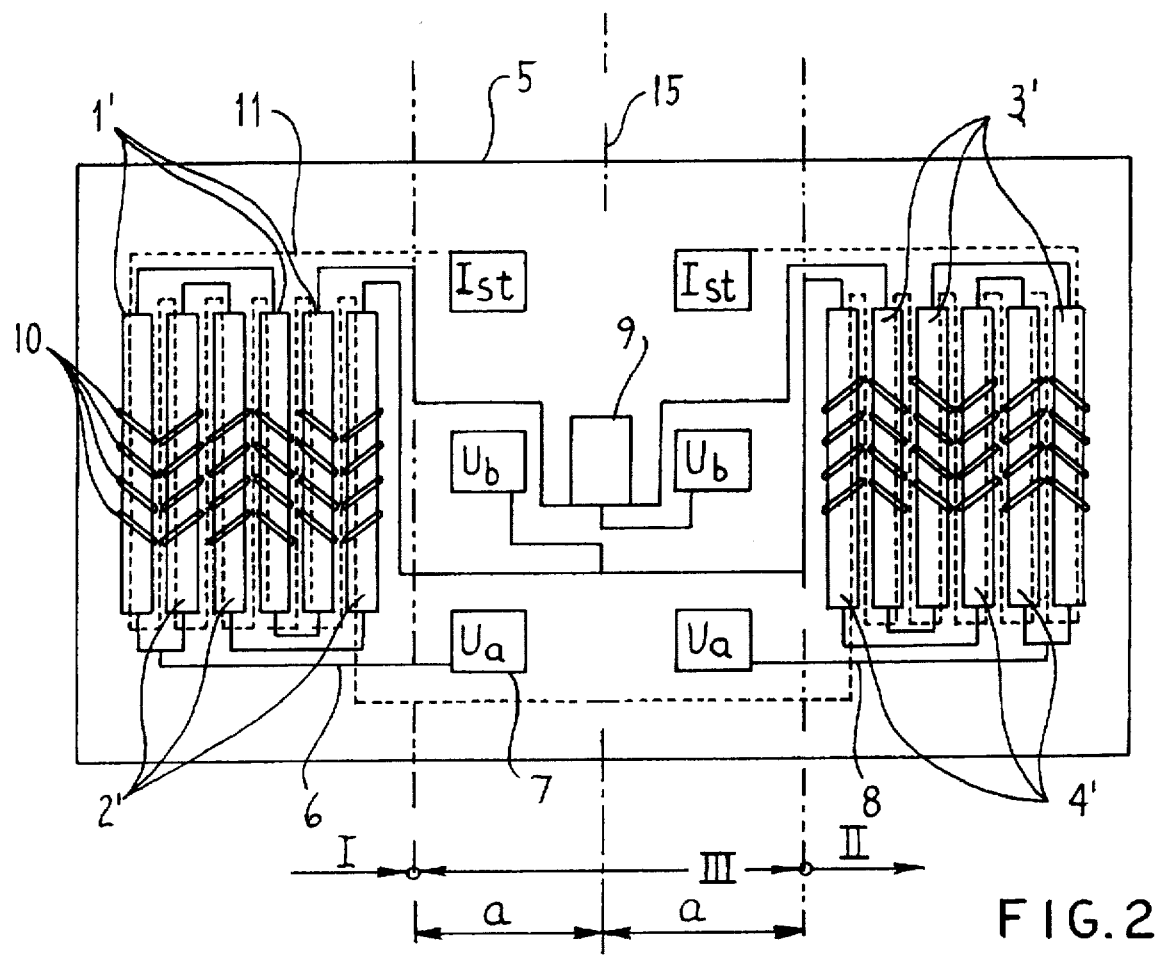
FIG. 2 shows a sensor chip according to the invention.

The details of the sensor chip of the invention can be recognized in the illustration of FIG. 2. The sensor chip 5 has two areas I and II, which respectfully include resistor pairs 1 and 2 and 3 and 4 which are equally spaced from a center axis 15. The resistors 1, 2, 3, 4 each consist of three laminated magnetoresistive strips 1', 2', 3', 4', respectively, which are parallel to one another and which have in a conventional manner barberpole structures 10. The barberpole structures 10 are symmetrical in all resistors 1, 2, 3, 4. Thus care is taken that only one applied field gradient controls the bridge. The resistor pairs 1/2 and 3/4 respectively form bridge branches A and B. This becomes also clear from the conductors 6 between the laminated strips 1', 2', 3', 4' and the conductors 8 leading outwardly from the laminated strips 1', 2', 3', 4'. Conductors 8 connect surface terminals 7 to the laminated strips 1', 2', 3', 4'. The surface terminals 7 form contacts projecting for the sensor chip 5 to which the operating voltage $U_b$ is applied and from which the output voltage $U_a$ is measured. Two additional surface terminals 7 serve as external contacts for supplying the control current $I_{st}$. The surface terminals 7 are arranged symmetrically with respect to the center axis 15 in the center area III of the sensor chip 5.

As further observed in FIG. 2, the laminated strips 1' and 2' and 3' and 4' forming bridge branches A and B respectively are interleaved. In area I it can be seen that from the left sensor chip 5 has a first laminated strip 1' located adjacent two adjacent first and second laminated strips 2'.

As can also be seen by the orientation of the barberpole elements 10, the laminated strips 1', 2', 3', 4' are arranged so that when exposed to opposed magnetic fields through the application of current $I_o$, the adjacent resistors undergo opposite changes in resistivity. Thus, resistors 1 and 2 undergo opposite changes in resistivity, resistors 3 and 4 undergo opposite changes in resistivity. Since resistors 1 and 3 have the same barber-pole orientation, they undergo opposite changes in resistivity. Since resistors 2 and 4 have the same barber-pole orientation, they undergo opposite changes in resistivity.

Furthermore an adjustable resistor 9, which in the illustrated manner is connected in series with the bridge branches A and B of the Wheatstone bridge is provided on the area of this center axis 15. The resistor 9 can be removed mechanically or by means of laser, with this removal being done in such a manner that the symmetry of the entire arrangement is maintained.

The output voltage $U_a$ is fed to an amplifier (not shown). Its output, the control current $I_{st}$, is adjusted such that the effect of the outer magnetic-field gradient at the place of the laminated strips 1', 2', 3', 4' is cancelled. The control current $I_{st}$ forms the output signal of the arrangement. It is directly proportional to the magnetic-field gradient and does not depend on the temperature and large-area interference magnetic fields. For example, in some versions of the invention the terminals 7 across which $U_a$ is measured are tied to the opposed inputs of an operational amplifier; the amplifier's output is then feed back to strip line conductor 15 to function as the $I_{st}$ signal. A voltage representative of $I_{st}$ and the $I_o$ measured current is then measured across a resistor through which $I_{st}$ is tied to ground. The output current $I_{st}$ from the operational amplifier is employed as the measure of the current $I_o$ because it, unlike $U_a$, varies substantially linearly with $I_o$.

The inventive arrangement of the substantial axis symmetry at the sensor chip 5 takes care that the warming-up occurs in symmetry with the center axis 15. The resistance changes in the laminated strips 1', 2', 3', 4' caused by magnetorestriction are therefore the same all over and do not cause a change of the output voltage $U_a$. Zero-point drift of output voltage as a function of temperature is thus substantially eliminated. Moreover, since the resistors forming the individual bridge branches A and B are located in the same areas I and II, respectively, of the sensor assembly the temperatures of the resistors forming each bridge branch should be substantially identical. This substantially eliminates the problem of $U_a$ signal drift occurring as a result of the individual bridge branch resistors having different temperatures. Thus, uneven heating of the sensor assembly owing to the asymmetric arrangement of adjacent heat generating components will not adversely effect the accuracy of the current measurements. Also, the trimming of the Wheatstone bridge is done in an axis-symmetrical manner since the resistor 9 is arranged in the center axis 15. In this manner it is possible to adjust the output voltage $U_a$ towards zero when no magnetic-field gradient exists.

Figure 3:
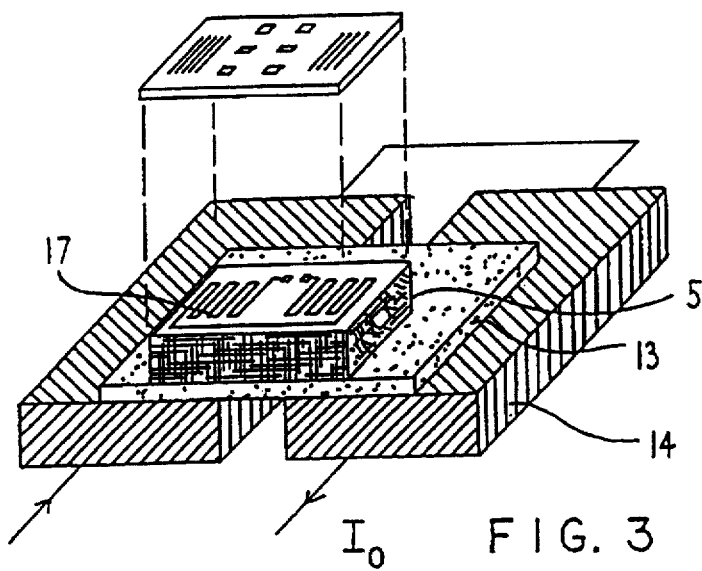
FIG. 3 shows the connection of a sensor chip of the invention to a circuit for measuring the current flowing therein.
Figure 4:
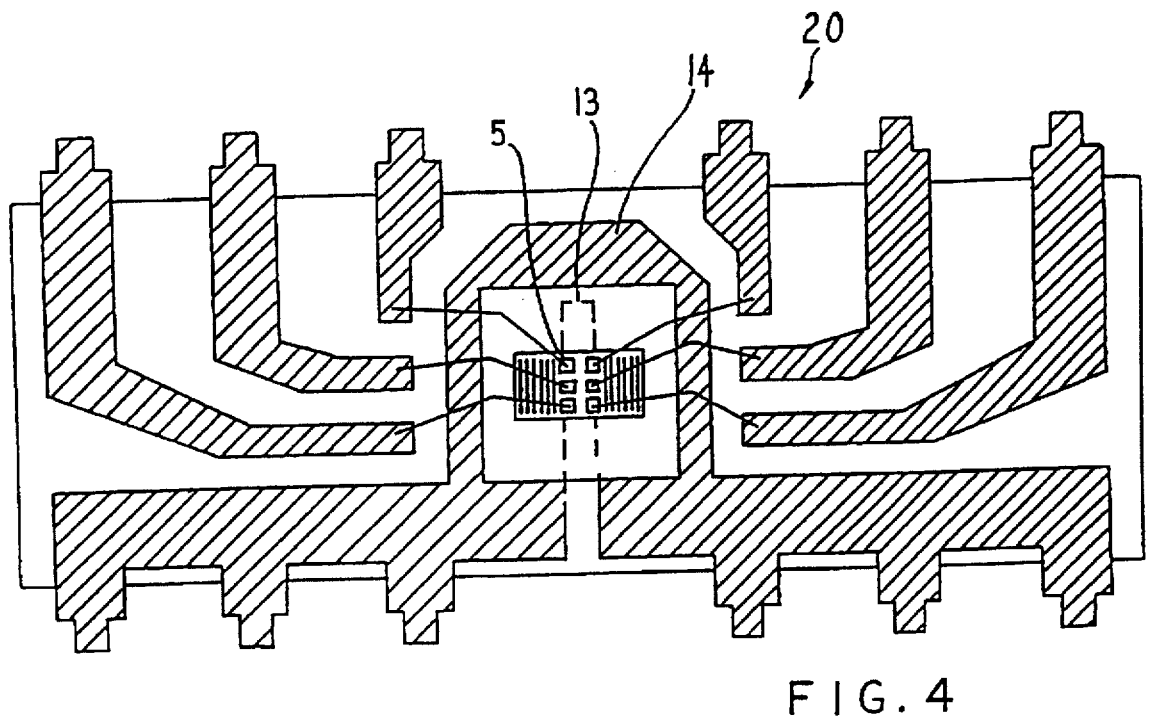
FIG. 4 shows the design of the connecting contacts and of the power supply in an arrangement according to FIG. 3.

FIGS. 3 and 4 show a single-package sensor assembly 20 that incorporates sensor chip 5 of this invention to measure current intensity $I_o$ of an electric current $I_o$ through lines 14 formed on a dual-in-line-pin package. The sensor chip 5 is electrically separated from the line 14 by an insulating layer 13. Two lines 14 are provided, through which current $I_o$ flows, as is illustrated in FIG. 3, in one direction relative to one bridge branch A and in the opposite direction through the other bridge branch B. With this magnetic-field gradient is created, which is proportional to the current $I_o$ in the line 14, interference magnetic fields, which can be caused by other currents passing nearby, do not have any effect on the output signal, the control current $I_{st}$, since their magnetic fields act in the same degree on the two symmetrical areas I and II. What contributes to this is that the distances between the areas I and II are smaller than 1 mm.

FIG. 4 shows a single dual-in-line pin sensor assembly package 20 for the potential-free measuring of the current intensity $I_o$. Both lines 14 are here formed such that again a magnetic-field gradient is created at the place of the sensor chip 5. The insulation 13 between the sensor chip 5 and the line 14 and the arrangement of the structural-element pins for the current $I_o$ and for supplying the sensor chip 5 on opposite sides of the structural element provide here for a high protective insulation voltage. In other versions of the invention sensor chip 5 may be packaged separately from the associated conductors 14.

The embodiments of the invention in which an exclusive property or privilege is claimed are defined as follows:

1. A sensor chip with a bridge circuit in the form of a Wheatstone bridge for measuring the gradient of the strength of a magnetic field, the Wheatstone bridge consisting of two parallel-connected bridge branches, wherein a first bridge branch consists of first and second magnetoresistive resistors that are series-connected together, a second bridge branch consists of third and fourth magnetoresistive resistors that are series-connected together, the first and third magnetoresistive resistors are connected together at one end of the Wheatstone bridge and the second and fourth magnetoresistive resistors are connected together at a second end of the Wheatstone bridge, each magnetoresistive resistor consisting of a plurality of magnetoresistive laminated strips, each magnetoresistive laminated strip having a specific barber-pole orientation that determines the effect the magnetic field has on the resistance of the magnetoresistive laminated strip, wherein the magnetoresistive resistors are located in two areas which are symmetrically arranged a common distance from a longitudinal center axis of the sensor chip, the improvement wherein:

each area includes the magnetoresistive resistors that form a single one of the bridge branches;

the magnetoresistive laminated strips forming each magnetoresistive resistor have the same barber-pole orientation;

the first and third magnetoresistive resistors have the game barber-pole orientation and are symmetrically arranged around the center axis of the sensor chip and the second and fourth magnetoresistive resistors have the same barber-pole orientation that is different from the orientation of the first and third magnetoresistive resistors and are symmetrically arranged around the center axis of the chip; and within each area, the magnetoresistive laminated strips forming the magnetoresistive resistors within the area are symmetrically arranged.

2. The sensor chip according to claim 1, wherein the magnetoresistive laminated strips are arranged parallel to one another with respect to their longitudinal axes.

3. The sensor chip according to claim 1, wherein above or below at least one magnetoresistive laminated strip there is provided a thin-layer strip line conductor that is insulated from the magnetoresistive laminated strip and through which a measurable electrical control current can flow.

4. The sensor chip according to claim 3, wherein a plurality of thin-layer strip line conductors are provided.

5. The sensor chip according to claim 4, wherein a thin-layer strip line conductor is provided above or below each magnetoresistive resistor.

6. The sensor chip according to claim 4, wherein the thin-layer strip line conductors are arranged symmetrically with respect to the center axis of the sensor chip.

7. The sensor chip according to claim 1, wherein an adjustable resistor is connected in series with the bridge branches of the Wheatstone bridge.

8. The sensor chip according to claim 1, wherein terminal contacts are provided on a surface of the sensor chip for applying an operating voltage to the Wheatstone bridge and for measuring an output voltage of the Wheatstone bridge.

9. The sensor chip according to claim 8, wherein the terminal contacts are arranged symmetrically with respect to the center axis of the sensor chip.

10. The sensor chip according to claim 9, wherein the terminal contacts are located in a center area of the sensor chip, the center area being between the areas in which the magnetoresistive resistors are located.

11. The sensor chip according to claim 1, wherein the magnetoresistive laminated strips are arranged in one plane.

12. The sensor chip according to claim 11, wherein electrical conductors extend between the magnetoresistive laminated strips and the electric conductors are arranged in the same plane as the magnetoresistive laminated strips.

13. The sensor chip according to claim 7, wherein the adjustable resistor is positioned symmetrically with respect to the center axis of the sensor chip.

14. The sensor chip according to claim 13, wherein the the resistance of the adjustable resistor is set through mechanical removal of portions of the adjustable resistor.

15. The sensor chip of claim 1, wherein the magnetoresistive laminated strips forming the individual magnetoresistive resistors within each area are interleaved with each other and are further arranged so that the magnetoresistive laminated strips of a first one of the magnetoresistive resistors are symmetrically arranged with the magnetoresistive laminated strips of a second one of the magnetoresistive resistors.

16. The sensor chip of claim 15, wherein each magnetoresistive resistor is formed from three magnetoresistive laminated strips.

17. The sensor chip of claim 15, wherein each magnetoresistive resistor is formed from three magnetoresistive laminated strips and the magnetoresistive laminated strips are arranged so that two magnetoresistive laminated strips forming one magnetoresistive resistor are adjacent each other.

18. A sensor assembly for measuring current flow, said sensor assembly including:
two parallel, series-connected conductive members for receiving the current to be measured so that the current flows through a first one of the conductive members in a first direction and through a second one of the conductive members in a second direction opposite the first direction; and a sensor unit disposed over the conductive members, the sensor unit including a Wheatstone bridge, the Wheatstone bridge consisting of a plurality of magnetoresistive resistors that are arranged to form two parallel-connected bridge branches, each bridge branch having first and second magnetoresistive resistors that are series-connected together, and wherein the first magnetoresistive resistors are connected together at a first end of the Wheatstone bridge and the second magnetoresistive resistors are connected together at a second end of the Wheatstone bridge, each magnetoresistive resistor consisting of a plurality of magnetoresistive laminated strips, each magnetoresistive laminated strip having a specific barber-pole orientation that determines the effect a magnetic field has on the magnetoresistive laminated strip and the magnetoresistive laminated strips forming each magnetoresistive resistor having the same barber-pole orientation, wherein:

the magnetoresistive resistors forming each bridge branch are located together in separate areas of the sensor unit, the separate areas being symmetrically spaced relative to a center axis of the sensor unit and each being located adjacent a separate one of the conductive members;

the first magnetoresistive resistors have the same barber-pole orientation and are symmetrically arranged relative to the center axis of the sensor unit and the second magnetoresistive resistors have the same barber-pole orientation that is different from the barber-pole orientation of the first magnetoresistive resistors and are symmetrically arranged relative to the center axis of the sensor unit; and within each separate area in which the magnetoresistive resistors are located, the magnetoresistive laminated strips forming the first magnetoresistive resistor of the bridge branch are symmetrically arranged with the magnetoresistive laminated strips forming the second magnetoresistive resistor of the bridge branch.

19. The sensor assembly of claim 18, wherein within each separate area of the sensor unit in which the magnetoresistive resistors are located, the magnetoresistive laminated strips forming the individual magnetoresistive resistors of the bridge branch are interleaved with each other and are further arranged so that the magnetoresistive laminated strips of the first magnetoresistive resistor are symmetrically arranged with the magnetoresistive laminated strips of the second magnetoresistive resistor.

20. The sensor assembly of claim 19, wherein each magnetoresistive resistor is formed from three magnetoresistive laminated strips.

21. The sensor assembly of claim 19, wherein each magnetoresistive resistor is formed from three magnetoresistive laminated strips and the magnetoresistive laminated strips are arranged so that two magnetoresistive laminated strips forming one magnetoresistive resistor are adjacent each other.

22. The sensor assembly of claim 18, wherein:
said series-connected conductive members are located on first plane and said magnetoresistive resistors are located on a second plane that is parallel to and spaced from said first plane; and a strip line conductor is located on a third plane so as to partially subtend a space subtended by at least one of said magnetoresistive resistors, said third plane being parallel to said second plane and being proximal to said magnetoresistive resistors relative to said first plane.

23. The sensor assembly of claim 22, further including a first set of terminals for applying voltages to and measuring voltages of said Wheatstone bridge and a second set of terminals for apply a voltage to said strip line conductor, wherein said first set of terminals and said second set of terminals are located on a common surface portion of said sensor unit.

24. The sensor assembly of claim 22, wherein said strip-line conductor subtends each said magnetoresistive resistor.

* * * * *